US009879359B2

(12) United States Patent
Fujibayashi et al.

(10) Patent No.: US 9,879,359 B2
(45) Date of Patent: Jan. 30, 2018

(54) SILICON CARBIDE SEMICONDUCTOR FILM-FORMING APPARATUS AND FILM-FORMING METHOD USING THE SAME

(71) Applicants: DENSO CORPORATION, Kariya, Aichi-pref. (JP); CENTRAL RESEARCH INSTITUTE OF ELECTRIC POWER INDUSTRY, Tokyo (JP); NuFlare Technology, Inc., Yokohama, Kanagawa (JP); TOYOTA JIDOSHA KABUSHIKI KAISHA, Toyota-shi, Aichi-ken (JP)

(72) Inventors: Hiroaki Fujibayashi, Kariya (JP); Masami Naito, Kariya (JP); Masahiko Ito, Yokosuka (JP); Isaho Kamata, Yokosuka (JP); Hidekazu Tsuchida, Yokosuka (JP); Hideki Ito, Yokohama (JP); Ayumu Adachi, Toyota (JP); Koichi Nishikawa, Nagakute (JP)

(73) Assignees: DENSO CORPORATION, Kariya (JP); CENTRAL RESEARCH INSTITUTE OF ELECTRIC POWER INDUSTRY, Tokyo (JP); NuFlare Technology, Inc., Yokohama (JP); TOYOTA JIDOSHA KABUSHIKI KAISHA, Toyota-shi (JP)

( * ) Notice: Subject to any disclaimer, the term of this patent is extended or adjusted under 35 U.S.C. 154(b) by 109 days.

(21) Appl. No.: 14/899,273

(22) PCT Filed: Jun. 19, 2014

(86) PCT No.: PCT/JP2014/003286
§ 371 (c)(1),
(2) Date: Dec. 17, 2015

(87) PCT Pub. No.: WO2014/203535
PCT Pub. Date: Dec. 24, 2014

(65) Prior Publication Data
US 2016/0138190 A1  May 19, 2016

(30) Foreign Application Priority Data
Jun. 21, 2013  (JP) .................. 2013-130836

(51) Int. Cl.
*C30B 23/06* (2006.01)
*C30B 25/14* (2006.01)
(Continued)

(52) U.S. Cl.
CPC ............ *C30B 25/14* (2013.01); *C23C 16/325* (2013.01); *C23C 16/4584* (2013.01);
(Continued)

(58) Field of Classification Search
CPC ................................ C30B 23/00; C30B 23/02
See application file for complete search history.

(56) References Cited

U.S. PATENT DOCUMENTS 5,871,586 A  2/1999 Crawley et al.
6,126,753 A  10/2000 Shinriki et al.
(Continued)

FOREIGN PATENT DOCUMENTS

JP  53-052356 A  5/1978
JP  05-082451 A  4/1993
(Continued)

OTHER PUBLICATIONS

International Search Report and Written Opinion of the International Searching Authority dated Sep. 22, 2014 issued in the corresponding International application No. PCT/JP2014/003286 (and English translation).

*Primary Examiner* — Robert M Kunemund
(74) *Attorney, Agent, or Firm* — Post Law Group, PLC

(57) ABSTRACT

In a silicon carbide semiconductor film forming apparatus, first to third gasses are introduced into first to third separation chambers through first to third inlets, respectively. The first and second gasses are silicon raw material including gas and carbon raw material including gas, and the third gas does not include silicon and carbon. The first and second gasses are independently supplied to growth space through first and second supply paths extending from the first and second separation chambers, respectively. The third gas is introduced through a third supply path from the third separation chamber between the first and second gasses.

14 Claims, 14 Drawing Sheets

(51) Int. Cl.
 *C30B 29/36* (2006.01)
 *C30B 25/16* (2006.01)
 *H01L 21/02* (2006.01)
 *C23C 16/32* (2006.01)
 *C23C 16/455* (2006.01)
 *C23C 16/458* (2006.01)

(52) U.S. Cl.
 CPC .... *C23C 16/4586* (2013.01); *C23C 16/45519* (2013.01); *C23C 16/45548* (2013.01); *C23C 16/45553* (2013.01); *C23C 16/45574* (2013.01); *C23C 16/45587* (2013.01); *C30B 25/165* (2013.01); *C30B 29/36* (2013.01); *H01L 21/0262* (2013.01); *H01L 21/02529* (2013.01); *H01L 21/02576* (2013.01); *H01L 21/02579* (2013.01); *H01L 21/02598* (2013.01)

(56) References Cited

U.S. PATENT DOCUMENTS

| | | |
|---|---|---|
| 2006/0021574 A1 | 2/2006 | Armour et al. |
| 2011/0212599 A1 | 9/2011 | Kuribayashi et al. |
| 2011/0265710 A1 | 11/2011 | Suzuki et al. |
| 2012/0067869 A1 | 3/2012 | Shirako et al. |

FOREIGN PATENT DOCUMENTS

| | | |
|---|---|---|
| JP | 10-064831 A | 3/1998 |
| JP | H11-323560 A | 11/1999 |
| JP | 2000-286201 A | 10/2000 |
| JP | 2003-183098 A | 7/2003 |
| JP | 2008-508744 A | 3/2008 |
| JP | 2009-105165 A | 5/2009 |
| JP | 2010-037157 A | 2/2010 |
| JP | 2011-195346 A | 10/2011 |
| JP | 2011-231388 A | 11/2011 |
| WO | 2003/019639 A1 | 3/2003 |
| WO | 2011/105122 A1 | 9/2011 |

//

SILICON CARBIDE SEMICONDUCTOR FILM-FORMING APPARATUS AND FILM-FORMING METHOD USING THE SAME

CROSS REFERENCE TO RELATED APPLICATIONS

This application is a U.S. national stage application of International Patent Application No. PCT/JP2014/003286 filed on Jun. 19, 2014 and is based on Japanese Patent Application No. 2013-130836 filed on Jun. 21, 2013, the disclosures of which are incorporated herein by reference.

TECHNICAL FIELD

The present disclosure relates to an SiC semiconductor film forming apparatus that epitaxially grows an SiC semiconductor, and a film forming method using the SiC semiconductor film forming apparatus.

BACKGROUND

Up to now, there are vertical SiC semiconductor film forming apparatuses that epitaxially grow an SiC semiconductor while supplying an Si raw material gas or a C raw material gas from above the SiC semiconductor substrate. In the vertical SiC semiconductor film forming apparatus of this type, for the purpose of improving the uniformity of a film thickness and a concentration, for example, a method of introducing the raw material gas with the concentrations of the respective raw material gases and a C/Si ratio kept uneven is employed. However, in the SiC semiconductor growth apparatus into which the raw material gases are mixed together and introduced, the Si raw material gas and the C raw material gas react with each other in a space before those raw material gases are introduced into a furnace body of the growth apparatus, and an unnecessary SiC product is formed on an introduction part and a wall surface into a particle source. This causes such a problem that a film quality of the SiC semiconductor epitaxially grown is deteriorated.

For that reason, Patent Literature 1 has proposed a method of isolating the Si raw material gas from the C raw material gas as a method of restraining the unnecessary SiC product from being formed. Specifically, in Patent Literature 1, a supply path for supplying the Si raw material gas is extended at a center position of the SiC semiconductor substrate, multiple openings for supplying the C raw material gas are provided around the supply path, the Si raw material gas is supplied from the center, and the C raw material gas is supplied from around the center.

However, in Patent Literature 1, a supply position of the Si raw material gas is fixed to the center position of the SiC semiconductor substrate, and a supply position of the C raw material gas is fixed around the Si raw material gas. The number of supply paths is formed at each location. For that reason, a raw material concentration distribution and a distribution of the C/Si ratio in a plane of the SiC semiconductor substrate cannot be controlled, and the in-plane uniformity of the thickness and the concentration of an epitaxial film cannot be controlled. Therefore, there arises such a problem that both of the suppression of particle generation and the in-plane uniformity of the film thickness and the concentration are not performed in the epitaxial film.

PATENT LITERATURE

Patent Literature 1: JP-2011-195346 A

SUMMARY

It is an object of the present disclosure to provide an SiC semiconductor film forming apparatus which performs both of the suppression of particle generation and the in-plane uniformity of the film thickness and the concentration in an SiC semiconductor to be epitaxially grown, and a film forming method using the SiC semiconductor film forming apparatus.

According to an aspect of the present disclosure, a silicon carbide semiconductor film forming apparatus includes: a furnace body that provides a growth space; a susceptor unit; a gas inlet; and a plurality of separation chambers. The susceptor unit is disposed in the furnace body, and provides an arrangement surface, on which an SiC semiconductor substrate is arranged. The gas inlet includes a first inlet, through which a first gas is introduced into the furnace body, a second inlet, through which a second gas is introduced into the furnace body, and a third inlet, through which a third gas is introduced into the furnace body. The first gas is one of an silicon raw material including gas and a carbon raw material including gas, the second gas is the other of the silicon raw material including gas and the carbon raw material including gas, and the third gas is a gas not including silicon and carbon.

The plurality of separation chambers are separated into an upper chamber and a lower chamber by a plurality of partition walls disposed in an upper part of an inside of the furnace body, and include a first separation chamber, into which the first gas is introduced through the first inlet, a second separation chamber, into which the second gas is introduced through the second inlet, and a third separation chamber, into which the third gas is introduced through the third inlet. The first separation chamber, the second separation chamber, and the third separation chamber are arranged in order from the upper part of the inside of the furnace body.

The partition wall partitioning the first separation chamber includes a plurality of first supply paths, each of which provides a supply path of the first gas and extends from the first separation chamber to a part of the inside of the furnace body below the plurality of separation chambers. The partition wall partitioning the second isolation chamber includes a plurality of second supply paths, each of which provides a supply path of the second gas and extends from the second separation chamber to another part of the inside of the furnace body below the plurality of separation chambers. The partition wall partitioning the third isolation chamber includes a plurality of third supply paths, each of which supplies the third gas between one of the first supply paths and one of the second supply paths. The first gas, the second gas and the third gas are supplied to the SiC semiconductor substrate through the first supply paths, the second supply paths and the third supply paths, respectively, and an SiC semiconductor is epitaxially grown on a surface of the SiC semiconductor substrate.

The use of the SiC semiconductor film forming apparatus performs both of the suppression of the particle generation in the SiC semiconductor to be epitaxially grown and the in-plane uniformity of the film thickness and the concentration.

According to another aspect of the present disclosure, a silicon carbide semiconductor film forming method using the silicon carbide semiconductor film forming apparatus according to the aspect of the present disclosure is presented. The silicon raw material including gas is a silicon raw material gas with HCl. The SiC semiconductor film forming method performs both of the suppression of the particle generation in the SiC semiconductor to be epitaxially grown and the in-plane uniformity of the film thickness and the concentration.

According to another aspect of the present disclosure, a silicon carbide semiconductor film forming method using the silicon carbide semiconductor film forming apparatus according to the aspect of the present disclosure is presented. The silicon raw material including gas is a silicon raw material gas with an inert gas as a carrier gas; and HCl is introduced from a gas inlet different from a gas inlet for the silicon raw material including gas. The SiC semiconductor film forming method performs both of the suppression of the particle generation in the SiC semiconductor to be epitaxially grown and the in-plane uniformity of the film thickness and the concentration.

According to another aspect of the present disclosure, a silicon carbide semiconductor film forming method using the silicon carbide semiconductor film forming apparatus according to the aspect of the present disclosure is presented. The silicon raw material including gas is a chloride-based raw material gas. The SiC semiconductor film forming method performs both of the suppression of the particle generation in the SiC semiconductor to be epitaxially grown and the in-plane uniformity of the film thickness and the concentration.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION (First Embodiment)

An SiC semiconductor film forming apparatus 10 according to a first embodiment of the present disclosure will be described with reference to FIGS. 1 and 2. FIG. 2 corresponds to a cross-sectional view taken along a line II-II in FIG. 1, and FIG. 1 corresponds to a cross-sectional view taken along a line I-I in FIG. 2.

Figure 1:
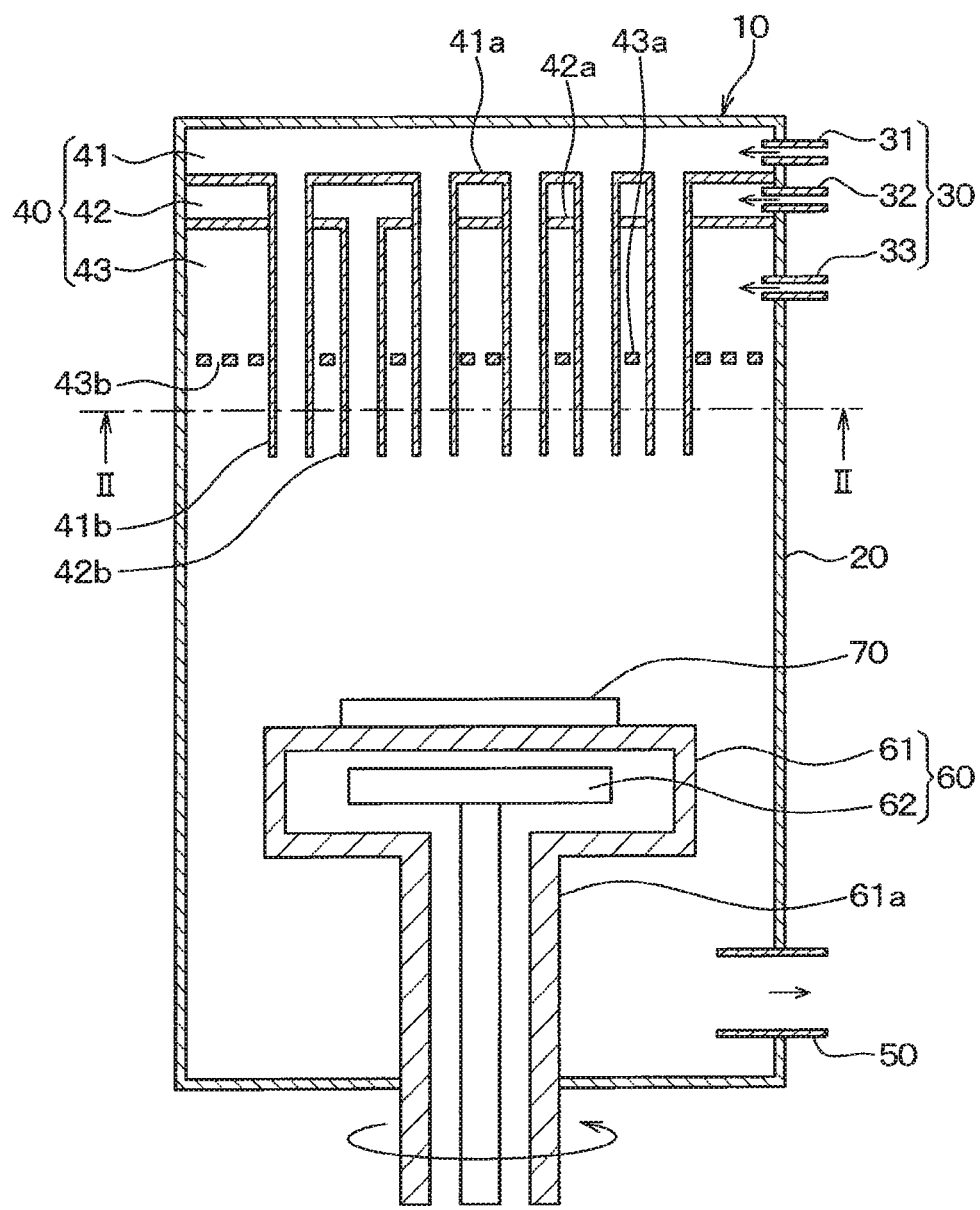
FIG. 1 is a cross-sectional view of an SiC semiconductor film forming apparatus according to a first embodiment of the present disclosure.
Figure 2:
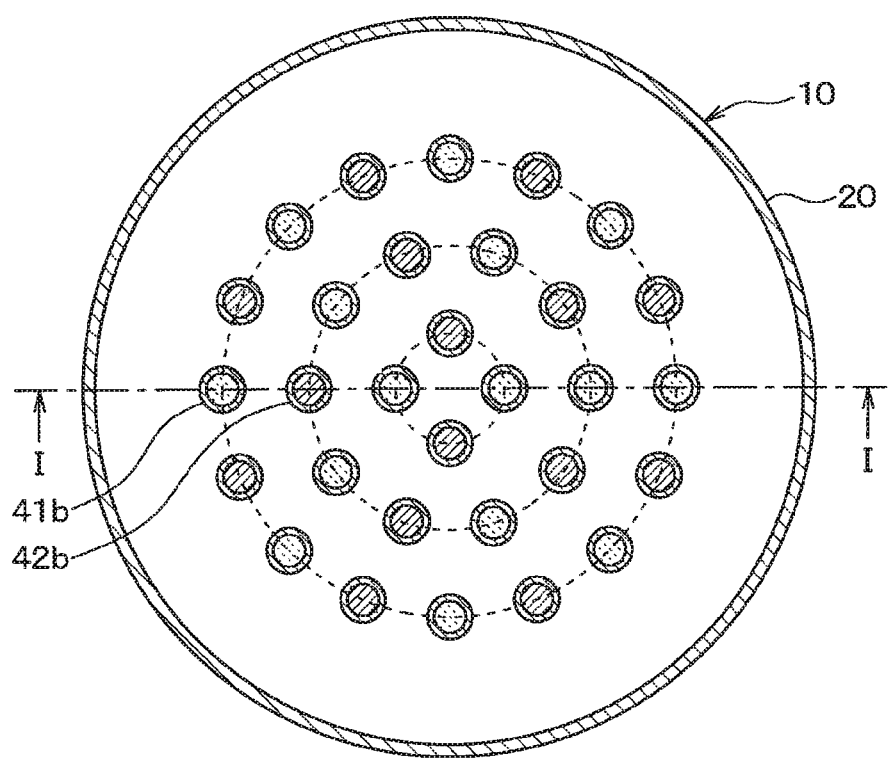
FIG. 2 is a cross-sectional view of the SiC semiconductor film forming apparatus taken along a line II-II in FIG. 1.

As illustrated in FIG. 1, the SiC semiconductor film forming apparatus 10 includes a furnace body 20, gas inlets 30, an isolation chamber 40, a gas outlet 50, and a susceptor part 60, and is placed such that a paper longitudinal direction in FIG. 1 matches a vertical direction.

The furnace body 20 is made of metal such as SUS, and formed of a cylindrical member having a hollow part defining a growth chamber. The SiC semiconductor film forming apparatus 10 has the isolation chamber 40 at an upper position of the interior of the furnace body 20, and has the susceptor part 60 at a lower position of the isolation chamber 40. An SiC semiconductor is allowed to epitaxially grow on a surface of an SiC semiconductor substrate 70 placed on the susceptor part 60.

The gas inlets 30 are inlets each for introducing a gas or a carrier gas containing a raw material of the SiC semiconductor into the furnace body 20. In the case of this embodiment, three inlets of first to third inlets 31 to 33 are provided as the gas inlets 30, and different types of gases are introduced through the respective inlets 31 to 33. Specifically, the respective inlets 31 to 33 are arranged on a side surface of the furnace body 20 side by side in the vertical direction. An Si raw material containing gas that contains an Si raw material is introduced as a first gas from a first inlet 31 located at an uppermost position. A C raw material containing gas containing a C raw material is introduced as a second gas from a second inlet 32 located at a second uppermost position. A third gas other than an SiC raw material is introduced from a third inlet 33 located at a lowermost position.

As the Si raw material containing gas, for example, as a silane gas, silane ($SiH_4$) as well as a chlorine-based Si raw material containing gas (chloride-based raw material) including Cl having an etching action such as $SiH_2Cl_2$, $SiHCl_3$, or $SiCl_4$ can be used. As the Si raw material containing gas, for example, a gas in which HCl is added to silane may be used. As the C raw material gas, for example, propane ($C_3H_8$) can be used. The third gas is a carrier gas containing none of Si and C, and can include a gas having an etching action including $H_2$ as well as an inert gas (rare gas) such as Ar or He. With the use of a gas including none of Si and C, the diffusion of the raw material gas outside of supply paths 41b and 42b, which may be generated when a gas containing Si or C is used is suppressed, and an unnecessary Si, C, or SiC product is restrained from being generated to prevent the generation of particle sources. The third gas also includes an impurity doping gas for controlling a conductivity type of the SiC semiconductor formed on the SiC semiconductor substrate 70, and, for example, includes $N_2$ when the conductive type is n-type, and includes trimethyl aluminum (TMA) when the conductivity type is p-type.

Although not shown in FIG. 1, the respective inlets 31 to 33 are connected to gas supply sources in which various gases are stored, and gas flow rates from the gas supply sources can be adjusted by flow adjustment mechanisms provided in the respective inlets 31 to 33.

The isolation chamber 40 is isolated into multiple chambers in a horizontal direction in the upper part of the interior of the furnace body 20, and enables various gases introduced from the gas inlets 30 to be introduced in an isolated state. In the case of this embodiment, the isolation chamber 40 includes first to third isolation chambers 41 to 43, and the respective first to third isolation chambers 41 to 43 are partitioned by multiple disk-shaped partition walls 41a to 43a arrayed in a central axis direction of the furnace body 20. Specifically, the uppermost first isolation chamber 41 is defined between the partition wall 41a and an upper surface of the furnace body 20, the second uppermost second isolation chamber 42 is defined between the partition walls 41a and 42a, and the lowermost third isolation chamber 43 is defined between the partition walls 42a and 43a.

The respective partition walls 41a to 43a are made of carbon (C) coated with SiC. The respective partition walls 41a to 43a are provided with supply paths 41b to 43b for supplying the gases introduced into the respective isolation chambers 41 to 43 to a growth space within the furnace body 20, that is, a space in which the SiC semiconductor substrate 70 is disposed below the respective first to third isolation chambers 41 to 43, respectively.

The supply paths 41b and 42b are each formed of a tubular member made of carbon coated with SiC, for example, a cylindrical member, and include multiple inlet pipes extended in a growth space direction below the partition wall 43a from the partition walls 41a and 42a. For that reason, the Si raw material containing gas is introduced into the growth space from the first isolation chamber 41 through the inlet pipes configuring the supply paths 41b without entering the second and third isolation chambers 42 and 43. The C raw material containing gas is introduced into the growth space from the second isolation chamber 42 through the inlet pipes configuring the supply path 42b without entering the third isolation chamber 43. The supply paths 43b are defined by multiple holes provided in the partition wall 43a, and the third gas is introduced into the growth space through the multiple holes.

The supply paths 43b are scattered between the multiple supply paths 41b and 42b extended from the respective first and second isolation chambers 41 and 42. The third gas introduced from the supply paths 43b flows between the inlet pipes configuring the respective supply paths 41b and 42b, and the third gas is supplied between the Si raw material containing gas and the C raw material containing gas. For example, the partition wall 43a is configured by a flow regulating plate, and the supply paths 43b can be defined by the multiple holes provided in the rectifier plate.

The respective partition walls 41a to 43a including the supply paths 41b and 42b can be made of other materials, but it is preferable to select an SiC material high in adhesion with SiC for suppression of the particles.

In the case of this embodiment, as illustrated in FIG. 2, the supply paths 41b and 42b are concentrically arranged at regular intervals around the central axis of the furnace body 20, and the supply paths 41b and the supply paths 42b are alternately arranged at regular intervals in a circumferential direction. For that reason, an introduction area ratio of the Si raw material containing gas and the C raw material containing gas becomes 1:1 in a radial direction from the central axis of the furnace body 20. In a region facing the SiC semiconductor substrate 70, an arrangement density that is the amount of arrangement of the supply paths 41b and 42b per unit area, in more detail, an in-plane distribution of an opening area density is uniform. The respective multiple supply paths 41b and 42b are arranged from the central axis of the furnace body 20 outward in the radial direction, and arranged up to a radially outer side of an outermost periphery of the SiC semiconductor substrate 70. With the above configuration, a growth rate of the SiC semiconductor can be prevented from decreasing in the outer peripheral part of the SiC semiconductor substrate 70.

Although the supply paths 43b are not illustrated in FIG. 2, the supply paths 43b are countlessly defined between the respective supply paths 41b and 42b. In FIG. 2, the interiors of the supply paths 41b and 42b are simply spatial, but in order to easily distinguish the supply paths 41b and 42b from each other, those supply paths are indicated by different hatchings.

The gas outlet 50 is disposed below an installation position of the SiC semiconductor substrate 70 on the susceptor part 60 in the furnace body 20, and discharges an unreacted gas that has passed through the SiC semiconductor substrate 70 placed on the susceptor part 60. Vacuum suction is performed from the gas outlet 50, and an atmospheric pressure in the furnace body 20 can be appropriately adjusted.

The susceptor part 60 includes a susceptor 61 that functions as a mount part on which the SiC semiconductor substrate 70 is placed, and a heating mechanism 62 that heats the SiC semiconductor substrate 70 placed in the susceptor 61. An upper surface of the susceptor 61 functions as an installation surface of the SiC semiconductor substrate 70, and a space in which the heating mechanism 62 is disposed is defined in an interior of the susceptor 61. A tubular support shaft 61a extending downward is disposed in the susceptor 61, and the support shaft 61a is coupled with a rotating mechanism not shown so as to be rotatable. The heating mechanism 62 is formed of a disc-shaped heater facing the installation surface on which the SiC semiconductor substrate 70 is placed, and disposed within the susceptor 61. The heating mechanism 62 is energized from an external through the interior of the support shaft 61a.

The SiC semiconductor film forming apparatus 10 is configured as described above. Subsequently, a film forming method for the SiC semiconductor with the use of the SiC semiconductor film forming apparatus 10 configured as described above will be described.

First, in the SiC semiconductor film forming apparatus 10, after the SiC semiconductor substrate 70 made of n-type or p-type SiC single crystal has been placed on the installation surface of the susceptor 61, the vacuum suction is performed through the gas outlet 50 to adjust the atmospheric pressure in the furnace body 20 to a desired pressure. The heating mechanism 62 is energized to heat the SiC semiconductor substrate 70 to, for example, about 1600° C. With the rotation of the susceptor 61, a temperature distribution in a plane of the SiC semiconductor substrate 70 is uniformized without being affected by a heat generation distribution of the heater.

Further, the SiC raw material containing gas, the C raw material containing gas, and the third gas are introduced through the first to third gas inlets 31 to 33. As a result, after various gases have been introduced into the first to third isolation chambers 41 to 43, separately, the various gases are introduced into the growth space in the furnace body 20 through the respective supply paths 41b to 43b.

When the various gases introduced through the respective supply paths 41b to 43b are introduced into the growth space, the gases are pyrolyzed in the vicinity of the SiC semiconductor substrate 70, and the SiC semiconductor is epitaxially grown on the SiC semiconductor substrate 70. For example, when $N_2$ is contained in the third gas, an n-type epitaxial layer can be grown as the SiC semiconductor. When TMA is contained in the third gas, a p-type epitaxial layer can be grown as the SiC semiconductor. This makes it possible to obtain an epitaxial substrate in which an n-type or p-type SiC semiconductor with a desired impurity concentration is epitaxially grown on the n-type or p-type SiC semiconductor substrate 70.

In this case, because the various gases are introduced into the respective isolation chambers 41 to 43, separately, the various gases are isolated from each other without any mixture. Because the third gas that is a gas other than the raw material gases is introduced between the Si raw material containing gas and the C raw material containing gas, the various gases can be first mixed together in the growth space after being discharged from outlets of the supply paths 41b and 42b. Since the third gas flows between the first and second gases, the diffusion of the first and second gases is reduced. For that reason, the raw material gas can be restrained from diffusing outside of the supply paths 41b and 42b, and unnecessary SiC products can be restrained from being generated. For that reason, the particle sources can be reduced, and the epitaxial growth small in the number of defects can be performed.

Since the multiple supply paths 41b for introducing the Si raw material containing gas and the multiple supply paths 42b for introducing the C raw material containing gas are provided in the plane of the SiC semiconductor substrate 70, the Si raw material containing gas and the C raw material containing gas can be supplied to a large area of a growth surface of the SiC semiconductor substrate 70 together. For that reason, the film thickness or the concentration of the SiC semiconductor can be prevented from being deviated such that a growth rate of the SiC semiconductor decreases in the outer peripheral part of the SiC semiconductor substrate 70, and the in-plane uniformity of the SiC semiconductor can be controlled. Therefore, both of the in-plane uniformities of the film thickness and the concentration of the SiC semiconductor can be performed while the particle generation caused by generating the unnecessary SiC products is suppressed.

In the case of this embodiment, because the arrangement density, that is, the opening area density of the supply paths 41b and 42b is uniformized in the plane of the SiC semiconductor substrate 70, the Si raw material containing gas and the C raw material containing gas can be uniformly supplied to the plane of the SiC semiconductor substrate 70. For that reason, the above advantages can be more obtained.

Further, the arrangement and the shape of the inlet pipes configuring the multiple supply paths 41b of the Si raw material containing gas and the multiple supply paths 42b of the C raw material containing gas can be controlled, independently, on the basis of which a raw material concentration center and a C/Si ratio in the plane can be finely adjusted.

As described above, any silane gas may be used as the Si raw material containing gas, but it is preferable that a chlorine Si raw material containing gas or a gas added with HCl is used as the Si raw material containing gas. The chlorine Si raw material containing gas is higher in decomposition temperature than silane. For that reason, when the chlorine Si raw material containing gas is used as the Si raw material containing gas, the generation of the unnecessary SiC products outside of the inlet paths of the supply paths 41b and 42b can be more suppressed. When the chlorine Si raw material containing gas or the gas added with HCl is used as the Si raw material containing gas, the etching effect of Cl can restrain the unnecessary SiC products from being generated outside of the supply paths 41b and 42b, and such an advantage that the particle sources can be reduced is obtained.

When an inert gas such as Ar or He is used as the carrier gas of the Si raw material containing gas, the decomposition of the Si raw material containing gas inside of the supply paths 41b can be suppressed, and the unnecessary Si products can be restrained from being generated inside of the supply paths 41b. Further, as described above, when HCl is added, HCl is introduced from, for example, an inlet (inlet 32 or inlet 33 in this embodiment) different from the inlet 31 for introducing the Si raw material containing gas among the gas inlets 30. With the above configuration, HCl is discharged from supply paths (supply paths 42b or supply paths 43b in this embodiment) different from the supply paths 41b from which the Si raw material containing gas is discharged. With the above configuration, because HCl can be introduced from the supply paths 42b and 43b different from the supply paths 41b of the Si raw material containing gas, a reaction of HCl with the Si raw material containing gas inside of the supply paths 41b can be suppressed. Therefore, the unnecessary Si products can be further restrained from being generated inside of the supply paths 41b, and such an advantage that the particle sources can be reduced can be obtained.

(Second Embodiment)

A second embodiment of the present disclosure will be described. In this embodiment, the arrangement density of supply paths 41b and 42b, that is, an opening area density of a portion for supplying a raw material gas is changed in the first embodiment, and the other configurations are identical with those in the first embodiment. Therefore, only portions different from those in the first embodiment will be described.

Figure 3:
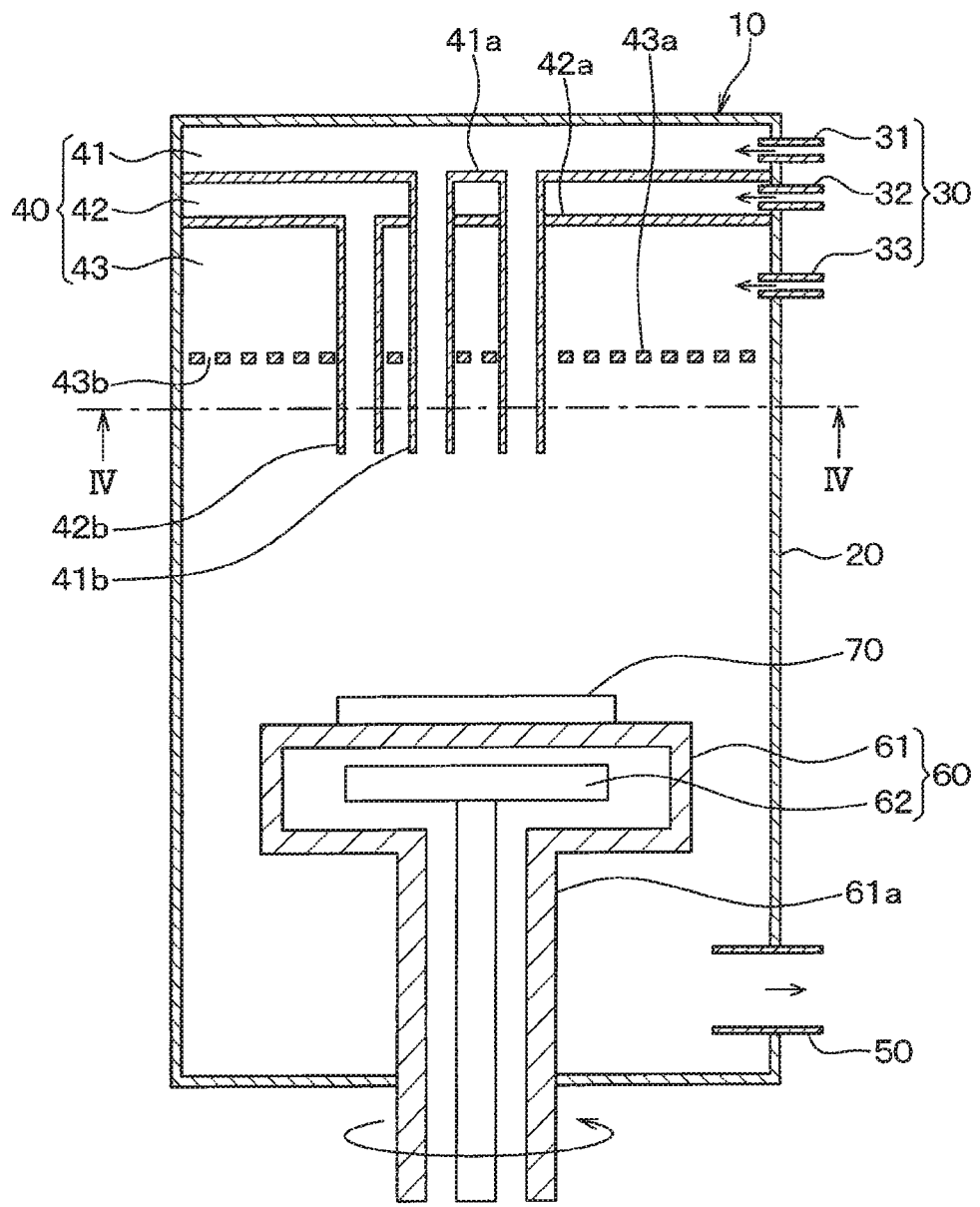
FIG. 3 is a cross-sectional view of an SiC semiconductor film forming apparatus according to a second embodiment of the present disclosure.
Figure 4:
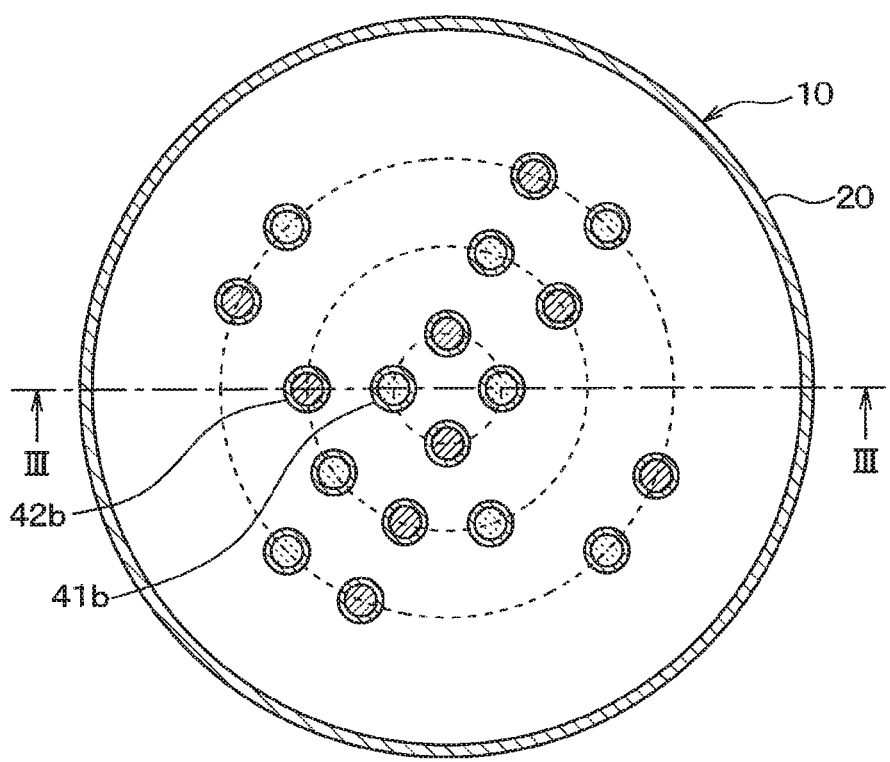
FIG. 4 is a cross-sectional view of the SiC semiconductor film forming apparatus taken along a line IV-IV in FIG. 3.

An SiC semiconductor film forming apparatus 10 according to this embodiment will be described with reference to FIGS. 3 and 4. FIG. 3 corresponds to a cross-sectional view taken along a line III-III in FIG. 4, and FIG. 4 corresponds to a cross-sectional view taken along a line IV-IV in FIG. 3.

As illustrated in those drawings, in this embodiment, the supply paths 41b and 42b are concentrically arranged at regular intervals outward in a radial direction from a central axis of a furnace body 20 while the supply paths 41b and 42b arranged within a concentric circle are scattered. With the above configuration, an increment in the number of supply paths 41b and 42b from the central axis of the furnace body 20 outward in the radial direction is set to be larger than that in the first embodiment. Therefore, in a region facing an SiC semiconductor substrate 70, an arrangement density which is the amount of placement of the supply paths 41b and 42b per unit area, that is, an opening area density of the supply paths 41b and 42b is reduced outward in the radial direction from the central axis of the furnace body 20. For that reason, the opening area density of the supply paths 41b and 42b is different between the central part and the outer peripheral part of the furnace body 20 in the radial direction, and a gas supply amount can be changed between the central part and the outer peripheral part of the SiC semiconductor substrate 70.

As described above, in the first embodiment, in the region facing the SiC semiconductor substrate 70, an in-plane distribution of an arrangement density of the supply paths 41b and 42b is uniform. For that reason, the raw material gases can be uniformly supplied to an overall surface of the SiC semiconductor substrate 70. However, the in-plane distribution may occur in the film thickness distribution and the concentration distribution of the SiC semiconductor formed on the SiC semiconductor substrate 70 due to the temperature distribution or a gas flow within the furnace body 20, or the gas type to be used. In that case, it is preferable to adjust those distributions with a change in the arrangement density of the supply paths 41b and 42b.

In the case of this embodiment, because the in-plane distribution of the supply paths 41b and 42b per unit area is reduced outward in the radial direction from the central axis of the furnace body 20, the film thickness of the SiC semiconductor is thin in the outer peripheral part of the SiC semiconductor substrate 70 as compared with the first embodiment. Therefore, when the SiC semiconductor is manufactured with the structure of the first embodiment, if the film thickness of the SiC semiconductor in the outer peripheral part of the SiC semiconductor substrate 70 becomes thicker than that in the central part, the SiC semiconductor film forming apparatus 10 having the configuration of this embodiment is used. With the above configuration, the SiC semiconductor having the uniform film thickness can be manufactured on the SiC semiconductor substrate 70.

In this example, as an example in which the opening area density of the supply paths 41b and 42b is set to be different between the central part and the outer peripheral part in the radial direction of the furnace body 20, the opening area density in the outer peripheral part decreases more than that in the central part. Conversely, the opening area density of the supply paths 41b and 42b in the central part may increase more than that in the outer peripheral part. It is preferable that the above configuration is applied to a case in which the film thickness of the SiC semiconductor in the central part of the SiC semiconductor substrate 70 is thicker than that in the outer peripheral part when the SiC semiconductor is manufactured with the structure of the first embodiment.

As described above, when the opening area density of the supply paths 41b and 42b is set to be different between the central part and the outer peripheral part of the furnace body 20 in the radial direction, the in-plane distribution of the raw material concentration can be adjusted. As a result, the uniformity of the film thickness can be performed by controlling the film thickness distribution.

(Third Embodiment)

A third embodiment of the present disclosure will be described. In this embodiment, a formation ratio of respective supply paths 41b and 42b, that is, an arrangement density of the respective supply paths 41b and 42b is changed as compared with the first embodiment, and other configurations are identical with those in the first embodiment. Therefore, only parts different from those in the first embodiment will be described.

Figure 5:
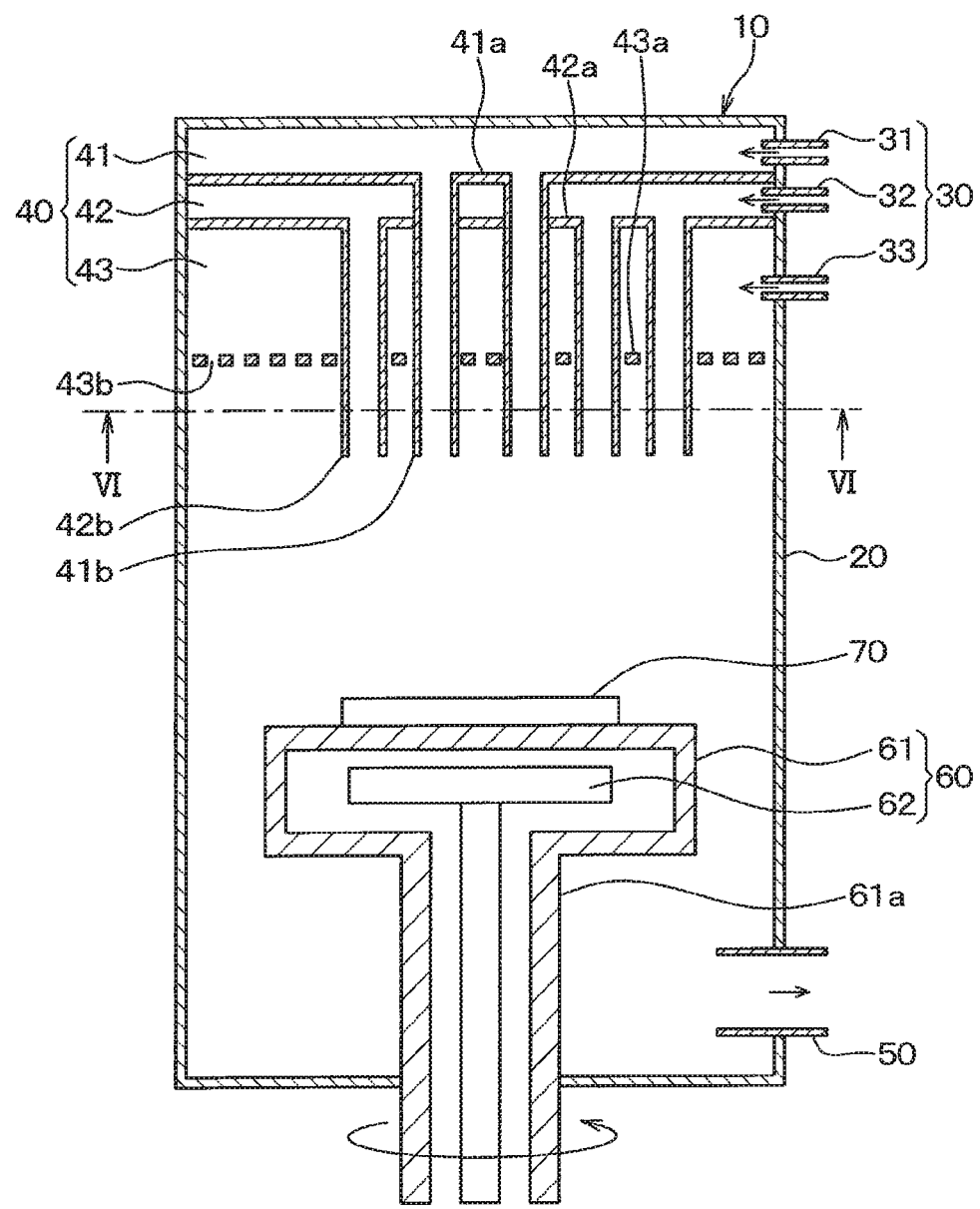
FIG. 5 is a cross-sectional view of an SiC semiconductor film forming apparatus according to a third embodiment of the present disclosure.
Figure 6:
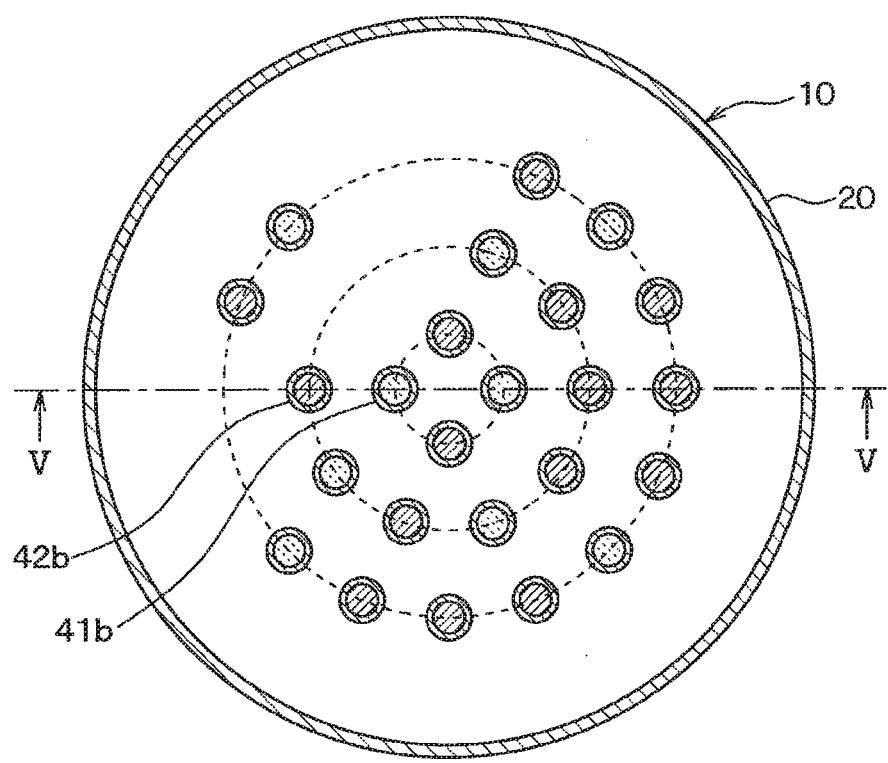
FIG. 6 is a cross-sectional view of the SiC semiconductor film forming apparatus taken along a line VI-VI in FIG. 5.

An SiC semiconductor film forming apparatus 10 according to this embodiment will be described with reference to FIGS. 5 and 6. FIG. 5 corresponds to a cross-sectional view taken along a line V-V in FIG. 6, and FIG. 6 corresponds to a cross-sectional view taken along a line VI-VI in FIG. 5.

As illustrated in those drawings, in this embodiment, the supply paths 41b and 42b are concentrically arranged at regular intervals outward in a radial direction from a central axis of a furnace body 20 while the arrangement density of the respective supply paths 41b and 42b arranged within a concentric circle is changed outward in the radial direction from the central axis of the furnace body 20. Specifically, a ratio of the arrangement density of the supply paths 42b for supplying the C raw material containing gas to the arrangement density of the supply paths 41b for supplying the Si raw material containing gas in the outer peripheral part of the furnace body 20 is set to be higher than that in the center of the furnace body 20. In other words, in a portion facing the installation surface of a susceptor part 60 on which an SiC semiconductor substrate 70 is placed, the opening area density of the supply paths 41b is set to be different from the opening area density of the supply paths 42b, and the latter is set to be higher than the former. With the above configuration, the C/Si ratio of the raw material gas to be supplied to the surface of the SiC semiconductor substrate 70 can be controlled in the central part and the outer peripheral part of the SiC semiconductor substrate 70, and a ratio of C in the C/Si ratio in the outer peripheral part can be set to be higher.

As described above, in the case of this embodiment, the ratio of the supply paths 42b for supplying the C raw material containing gas in the outer peripheral part is set to be higher than that in the center of the furnace body 20. For that reason, in the case where the n-type doping concentration in the outer peripheral part of the SiC semiconductor is higher than that in the central part when the SiC semiconductor is manufactured with the structure of the first embodiment, the SiC semiconductor film forming apparatus 10 having the configuration of this embodiment is used. With the above configuration, impurities are restrained from being taken in the outer peripheral part of the SiC semiconductor, the distribution of the n-type doping concentration in the central part and the outer peripheral part of the SiC semiconductor can be suppressed, and the SiC semiconductor uniform in the concentration distribution can be manufactured on the SiC semiconductor substrate 70. Since the in-plane distribution of the supply amount of the Si raw material containing gas and the C raw material containing gas can be controlled, independently, the film thickness distribution of the SiC semiconductor can be controlled, and the uniformity of the film thickness can be performed.

As an example in which the opening area density of the supply paths 41b is set to be different from the opening area density of the supply paths 42b, the latter is set to be higher than the former. Conversely, the former may be set to be higher than the latter. It is preferable that the above configuration is applied to a case in which the n-type doping concentration of the SiC semiconductor in the central part of the SiC semiconductor substrate 70 is higher than that in the outer peripheral part when the SiC semiconductor is manufactured with the structure of the first embodiment.

As described above, when the opening area density of the supply paths 41b is set to be different from the opening area density of the supply paths 42b, the in-plane distributions of the Si raw material containing gas and the C raw material containing gas can be adjusted, independently. As a result, the uniformity of the concentration and the film thickness can be performed by controlling the concentration distribution and the film thickness distribution in the plane.

(Fourth Embodiment)

A fourth embodiment of the present disclosure will be described. As compared with a case in which the in-plane distribution of the arrangement density of the supply paths 41b and 42b is uniformized in the entire area of a region facing the SiC semiconductor substrate 70 as in the first embodiment, a gas flow is likely to be disturbed when the arrangement density of the supply paths 41b and 42b is changed as in the second and third embodiments. When the gas flow is disturbed, the raw material gas flows back to upstream, and the unnecessary Si products are generated in the supply paths 41b and 42b into particle sources. In this embodiment, the disturbance of the gas flow described above is suppressed, and the particle sources are prevented from being formed.

Figure 7:
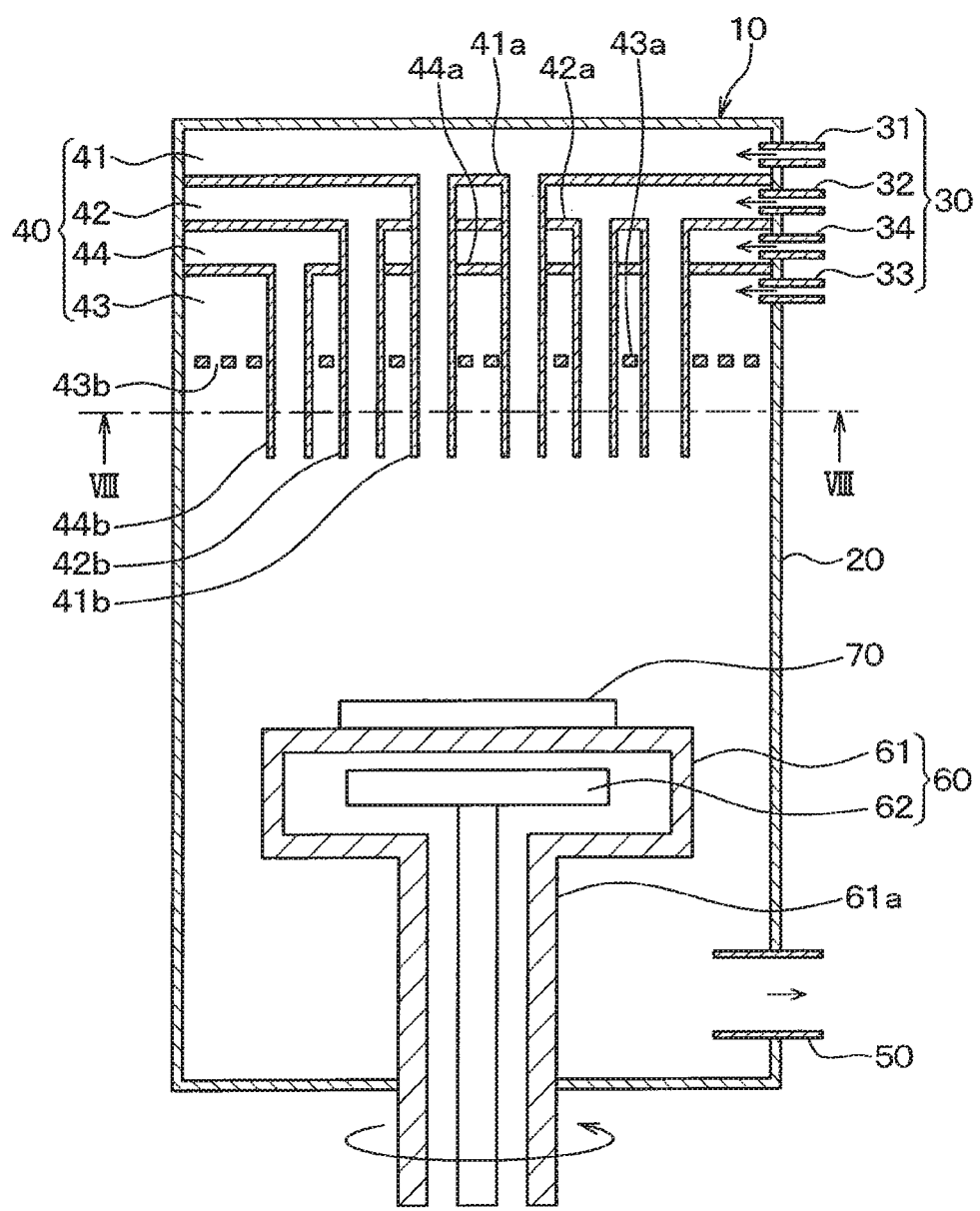
FIG. 7 is a cross-sectional view of an SiC semiconductor film forming apparatus according to a fourth embodiment of the present disclosure.
Figure 8:
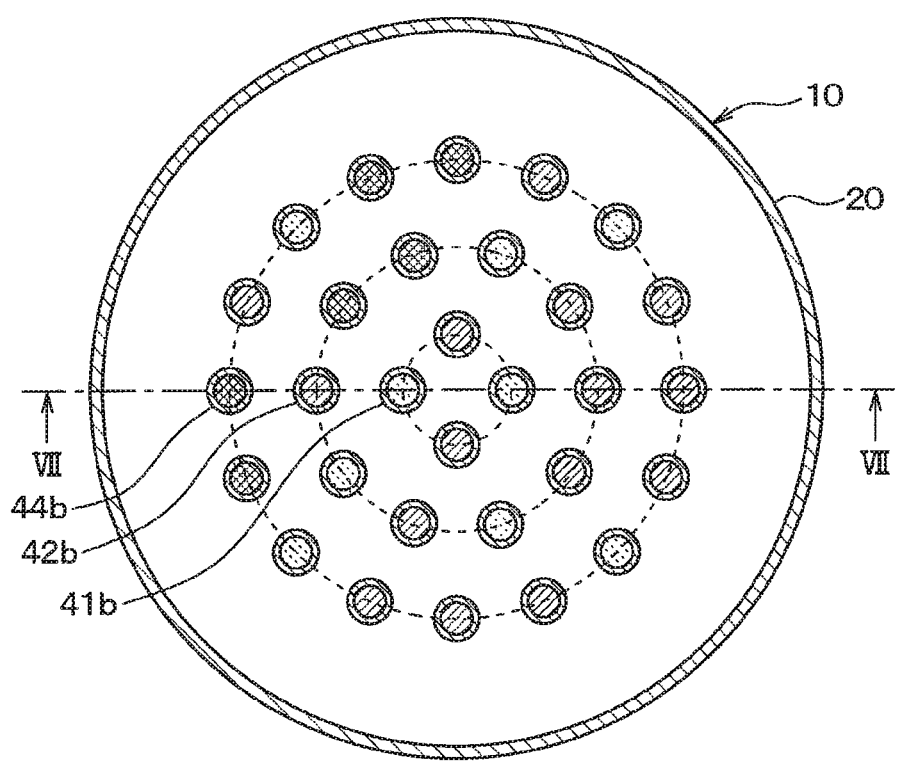
FIG. 8 is a cross-sectional view of the SiC semiconductor film forming apparatus taken along a line VIII-VIII in FIG. 7.

An SiC semiconductor film forming apparatus 10 according to this embodiment will be described with reference to FIGS. 7 and 8. FIG. 7 corresponds to a cross-sectional view taken along a line VII-VII in FIG. 8, and FIG. 8 corresponds to a cross-sectional view taken along a line VIII-VIII in FIG. 7.

As illustrated in FIG. 7, in this embodiment, an isolation chamber 40 further includes a fourth isolation chamber 44 as compared with the first embodiment. Specifically, a partition wall 44a is provided between a partition wall 42a and a partition wall 43a, and the fourth isolation chamber 44 is defined between the partition wall 42a and the partition wall 44a. As a gas inlet 30, a fourth inlet 34 for introducing a fourth gas is provided for the fourth isolation chamber 44, and supply paths 44b extending toward a growth space below the partition wall 43a are defined for the partition wall 44a. The supply paths 44b are concentrically disposed at regular intervals around a central axis of a furnace body 20 at places where the supply paths 41b and 42b are not arrayed, and arranged at regular intervals in a circumferential direction together with the supply paths 41b and 42b. The supply paths 44b enable the fourth gas in the fourth isolation chamber 44 to be supplied to the growth space. The fourth gas may be any gas containing none of an Si raw material and a C raw material, and includes, for example, the same carrier gas as that of the third gas, a gas with an etching action including $H_2$, or an inert gas (rare gas) such as Ar or He. A doping gas such as $N_2$ or TMA may be included in the carrier gas as the fourth gas. In FIG. 8, the interiors of the supply paths 41b, 42b, and 44b are merely spatial, but in order to easily distinguish the supply paths 41b, 42b, and 44b from each other, those supply paths are indicated by different hatchings.

As described above, the supply paths 44b are concentrically disposed at regular intervals around the central axis of the furnace body 20 at places where the supply paths 41b and 42b are not arrayed. As a result, the in-plane distribution of the gas supply can be eliminated. In other words, the supply paths 41b, 42b, and 44b are uniformly defined in a region facing a surface of the SiC semiconductor substrate 70, and the in-plane distribution of the arrangement density of those supply paths as a whole becomes uniform. As a result, the opening area density of the gas supply becomes equal between the central part and the outer peripheral part of the furnace body 20 in the radial direction. Therefore, the gas flow is restrained from being disturbed, the gas flow is stabilized, and the particle sources can be prevented from being formed.

As described above, in order to suppress drop of the particle sources, the supply paths 41b and 42b are made of carbon coated with SiC, but a material of the supply paths 44b may be selected according to the type of the fourth gas. In other words, it is preferable that the respective supply paths 41b to 44b are made of different materials according to the type of gas flowing in those supply paths. For example, when the fourth gas is $H_2$, it is conceivable that the material of the supply paths 44b is tungsten carbide (WC) or tantalum carbide (TaC) excellent in $H_2$ corrosion resistance, taking $H_2$ corrosion under a high temperature atmosphere into account. With the use of those materials, the particle generation caused by the deterioration of the members can be suppressed, and the SiC semiconductor small in the number of defects can be formed.

For the purpose of more restraining the disturbance of the gas flow from occurring, in a portion facing the SiC semiconductor substrate 70, the in-plane distribution of the opening area density combining the supply paths 41b, 42b, and 44b per unit area becomes equal between the central part and the outer peripheral part of the furnace body 20 in the radial direction. However, even if the in-plane distribution of the opening area density is not equal between the central part and the outer peripheral part of the furnace body 20 in the radial direction, even only the provision of the supply paths 44b for allowing the fourth gas to flow, independently, in addition to the first and second gases, contributes to the stabilization of the gas flow, and the above advantages can be obtained.

(Fifth Embodiment)

A fifth embodiment of the present disclosure will be described. As in the second embodiment, in this embodiment, the arrangement density of supply paths 41b and 42b, that is, the opening area density of a portion for supplying the raw material gas is changed as compared with the first embodiment.

Figure 9:
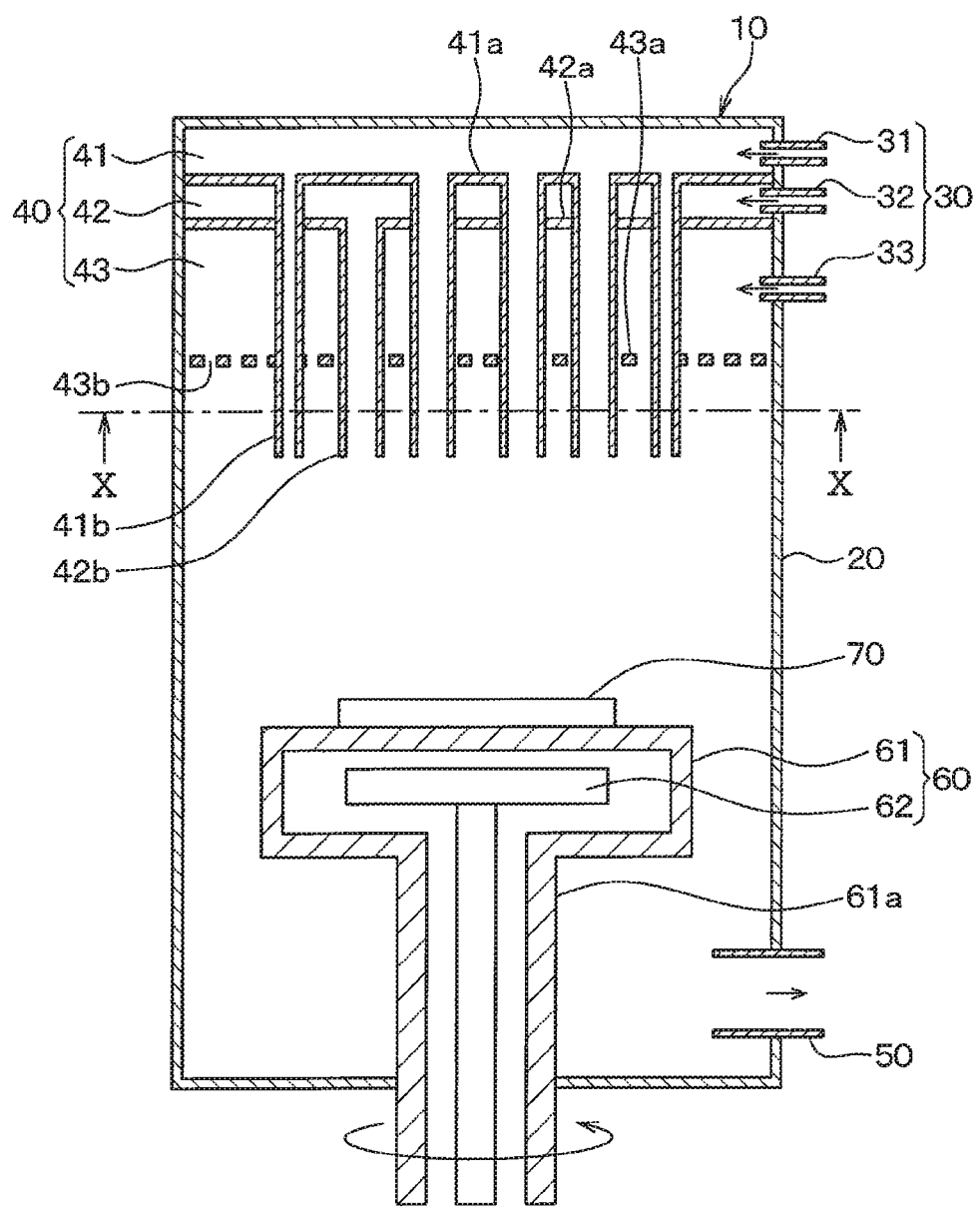
FIG. 9 is a cross-sectional view of an SiC semiconductor film forming apparatus according to a fifth embodiment of the present disclosure.
Figure 10:
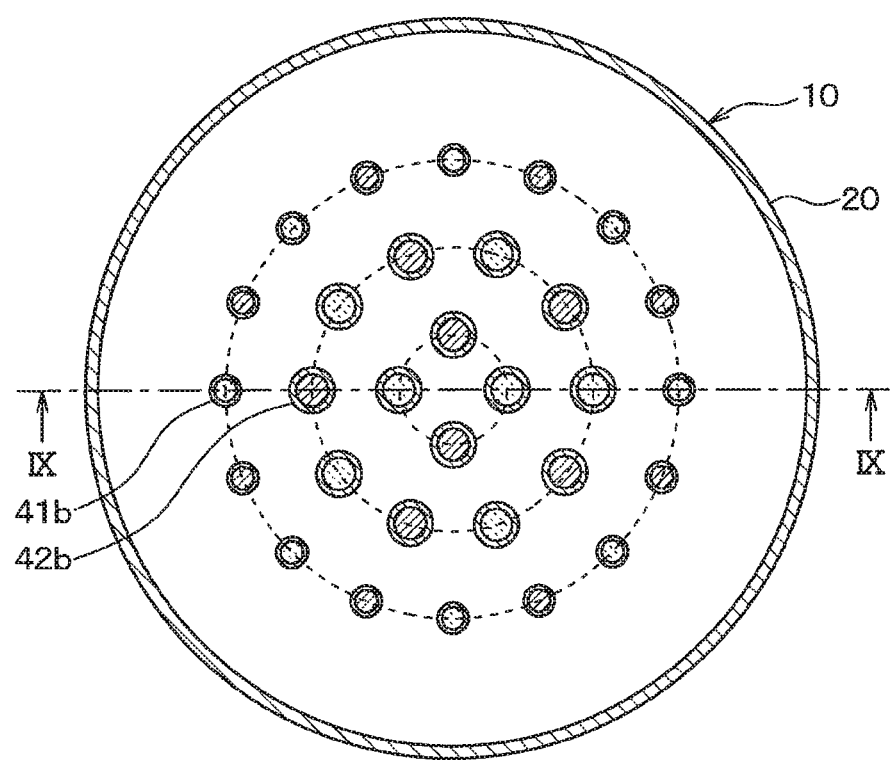
FIG. 10 is a cross-sectional view of the SiC semiconductor film forming apparatus taken along a line X-X in FIG. 9.

An SiC semiconductor film forming apparatus 10 according to this embodiment will be described with reference to FIGS. 9 and 10. FIG. 9 corresponds to a cross-sectional view taken along a line IX-IX in FIG. 10, and FIG. 10 corresponds to a cross-sectional view taken along a line X-X in FIG. 9.

As shown in those figures, in this embodiment, diameters (cross-sectional areas) of the supply paths 41b and 42b are changed outward in a radial direction from a central axis of a furnace body 20, and the diameters in an outer peripheral part are set to be smaller than those in a central part. With the above configuration, the opening area density of the supply paths 41b and 42b is reduced outward in the radial direction from the central axis of the furnace body 20 more than that in the first embodiment.

Even with the above configuration, the film thickness of the SiC semiconductor is thin in the outer peripheral part of an SiC semiconductor substrate 70 as compared with the first embodiment. Therefore, when the SiC semiconductor is manufactured with the structure of the first embodiment, if the film thickness of the SiC semiconductor in the outer peripheral part of the SiC semiconductor substrate 70 becomes thicker than that in the central part, the SiC semiconductor film forming apparatus 10 having the configuration of this embodiment is used. With the above configuration, the SiC semiconductor having the uniform film thickness can be manufactured on the SiC semiconductor substrate 70.

In this example, the diameters of the supply paths 41b and 42b in the outer peripheral part of the furnace body 20 are set to be smaller than those in the central part in the radial direction. Alternatively, the diameters in the central part can be set to be smaller than those in the outer peripheral part. It is preferable that the above configuration is applied to a case in which the film thickness of the SiC semiconductor in the central part of the SiC semiconductor substrate 70 is thicker than that in the outer peripheral part when the SiC semiconductor is manufactured with the structure of the first embodiment.

As described above, when the diameters of the supply paths 41b and 42b are set to be different between the central part and the outer peripheral part of the furnace body 20 in the radial direction, the in-plane distribution of the supply amount of the Si raw material containing gas and the C raw material containing gas can be adjusted, independently, and the uniformity of the concentration and the film thickness can be performed by controlling the concentration distribution and the film thickness distribution in the plane.

(Sixth Embodiment)

A sixth embodiment of the present disclosure will be described. Similarly, in this embodiment, a gas supply amount is changed between a central part and an outer peripheral part of an SiC semiconductor substrate 70 with a configuration different from that in the second to fourth embodiments as compared with the first embodiment.

Figure 11:
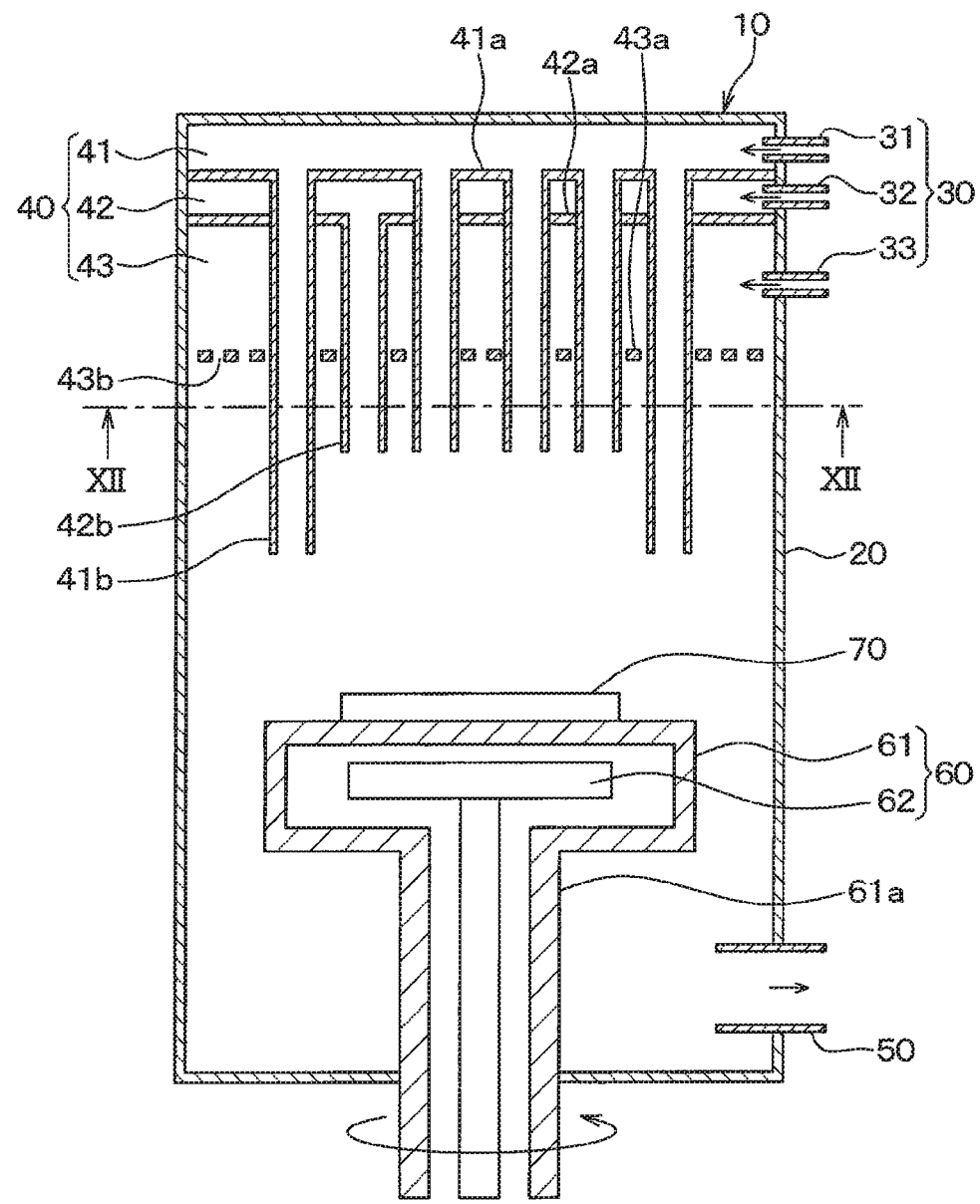
FIG. 11 is a cross-sectional view of an SiC semiconductor film forming apparatus according to a sixth embodiment of the present disclosure.
Figure 12:
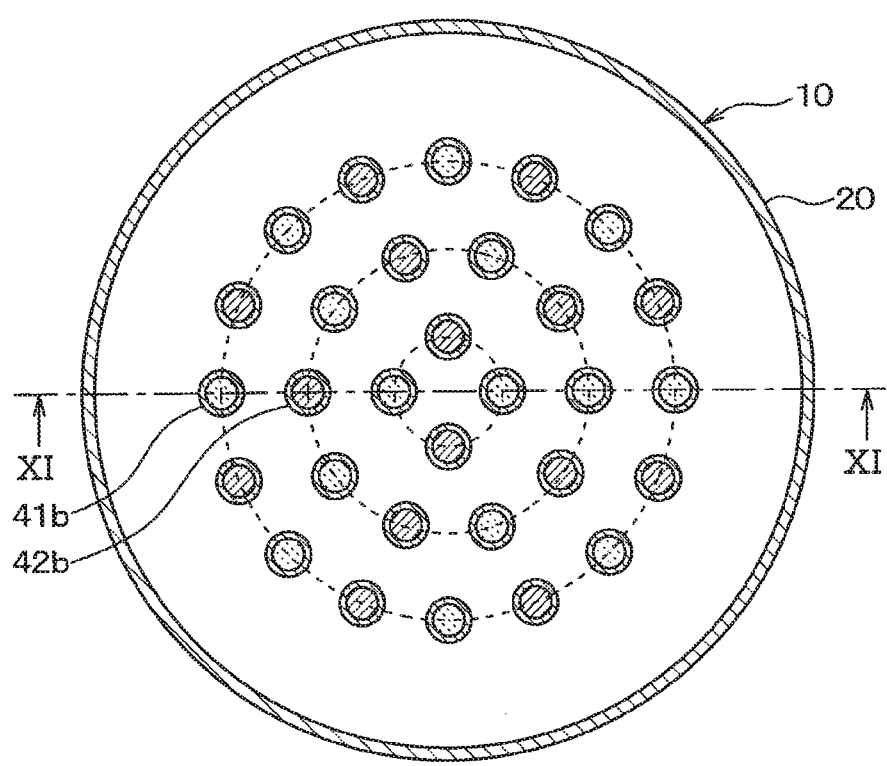
FIG. 12 is a cross-sectional view of the SiC semiconductor film forming apparatus taken along a line XII-XII in FIG. 11.

An SiC semiconductor film forming apparatus 10 according to this embodiment will be described with reference to FIGS. 11 and 12. FIG. 11 corresponds to a cross-sectional view taken along a line XI-XI in FIG. 12, and FIG. 12 corresponds to a cross-sectional view taken along a line XII-XII in FIG. 11.

As shown in those figures, in this embodiment, a length of supply paths 41b for supplying an SiC raw material containing gas in an outer peripheral part of a furnace body 20 in a radial direction is set to be larger than that in a central part of the furnace body 20. In other words, a distance from an installation surface of the SiC semiconductor substrate 70 or a susceptor 61 to outlets of the supply paths 41b in the outer peripheral part of the furnace body 20 in the radial direction is set to be shorter than that in the central part.

As described above, the length of the supply paths 41b in the outer peripheral part is set to be longer than that in the central part, and extended closer to the surface of the SiC semiconductor substrate 70. With the above configuration, the C/Si ratio of the raw material gas to be supplied to the surface of the SiC semiconductor substrate 70 can be controlled in the central part and the outer peripheral part of the SiC semiconductor substrate 70, and a ratio of Si in the C/Si ratio in the outer peripheral part can be set to be higher. For that reason, according to this embodiment, as compared with the first embodiment, an n-type doping concentration of the SiC semiconductor can be increased in the outer peripheral part of the SiC semiconductor substrate 70. Therefore, in the case where the n-type doping concentration in the central part of the SiC semiconductor is higher than that in the outer peripheral part when the SiC semiconductor is manufactured with the structure of the first embodiment, the SiC semiconductor film forming apparatus 10 having the configuration of this embodiment is used. With the above configuration, impurities are liable to be taken in the outer peripheral part of the SiC semiconductor, the distribution of the n-type doping concentration in the central part and the outer peripheral part of the SiC semiconductor can be suppressed, and the SiC semiconductor uniform in the concentration distribution can be manufactured on the SiC semiconductor substrate 70.

In this example, the length of the supply paths 41b for supplying the Si raw material containing gas is set to be larger. Alternatively, supply paths 42b side for supplying the C raw material containing gas may be set to be longer. In that case, the C/Si ratio of the raw material gas to be supplied to the surface of the SiC semiconductor substrate 70 can be controlled in the central part and the outer peripheral part of the SiC semiconductor substrate 70, and a ratio of C in the C/Si ratio in the outer peripheral part can be set to be higher. For that reason, with the above configuration, as compared with the first embodiment, an n-type doping concentration of the SiC semiconductor can be decreased in the outer peripheral part of the SiC semiconductor substrate 70.

Further, both of the supply paths 41b and 42b in the outer peripheral part of the SiC semiconductor substrate 70 may be set to be longer than those in the central part. With the above configuration, the supply amount of the raw material gas that reaches the surface in the outer peripheral part of the SiC semiconductor substrate 70 is larger than that in the first embodiment, and the raw material concentration becomes larger. For that reason, the film thickness of the SiC semiconductor is thick in the outer peripheral part of the SiC semiconductor substrate 70 as compared with the first embodiment. Therefore, the above configuration is applied to a case in which the film thickness of the SiC semiconductor in the outer peripheral part of the SiC semiconductor substrate 70 is thinner than that in the central part when the SiC semiconductor is manufactured with the structure of the first embodiment. With the above configuration, the SiC semiconductor having the uniform film thickness can be manufactured on the SiC semiconductor substrate 70.

Conversely, both of the supply paths 41b and 42b in the central part of the SiC semiconductor substrate 70 may be set to be longer than those in the outer peripheral part. With the above configuration, the supply amount of the raw material gas that reaches the surface in the central part of the SiC semiconductor substrate 70 is larger than that in the first embodiment, and the raw material concentration becomes larger. For that reason, the film thickness of the SiC semiconductor is thick in the central part of the SiC semiconductor substrate 70 as compared with the first embodiment. Therefore, the above configuration is applied to a case in which the film thickness of the SiC semiconductor in the central part of the SiC semiconductor substrate 70 is thinner than that in the outer peripheral part when the SiC semiconductor is manufactured with the structure of the first embodiment. With the above configuration, the SiC semiconductor having the uniform film thickness can be manufactured on the SiC semiconductor substrate 70.

As described above, not a change in the arrangement density or the diameter of the supply paths 41b and 42b, that is, the opening area density of the portion for supplying the raw material gas, but the supply paths 41b and 42b are lengthened whereby the C/Si ratio or the raw material concentration in the plane of the SiC semiconductor substrate 70 may be adjusted. This makes it possible to control the doping concentration of the SiC semiconductor or the in-plane uniformity of the film thickness with a high precision.

(Seventh Embodiment)

A seventh embodiment of the present disclosure will be described. In this embodiment, the gases to be supplied are increased and a heating method is changed as compared with the fourth embodiment, and other configurations are identical with those in the fourth embodiment. Therefore, only parts different from those in the fourth embodiment will be described.

Figure 13:
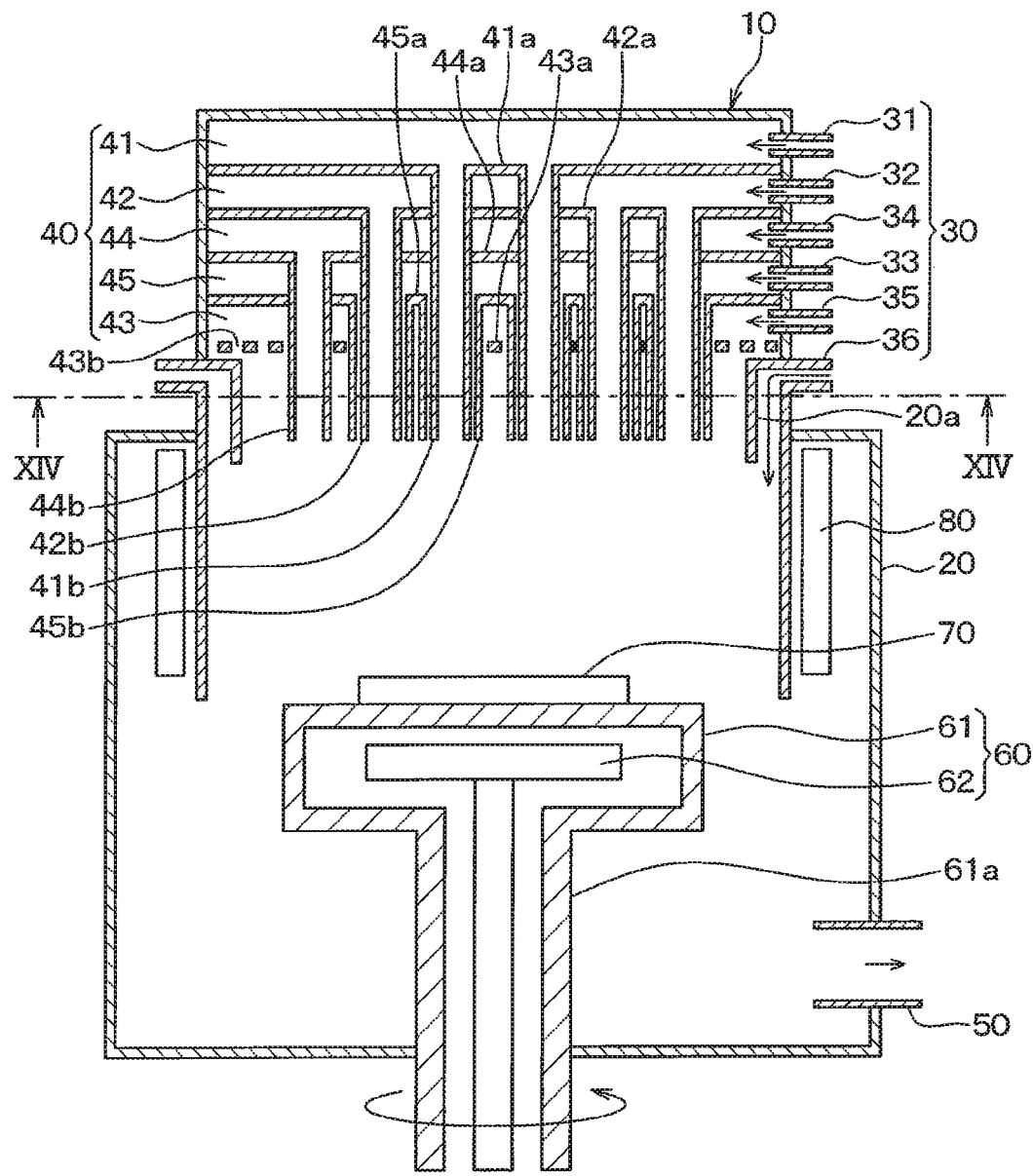
FIG. 13 is a cross-sectional view of an SiC semiconductor film forming apparatus according to a seventh embodiment of the present disclosure.
Figure 14:
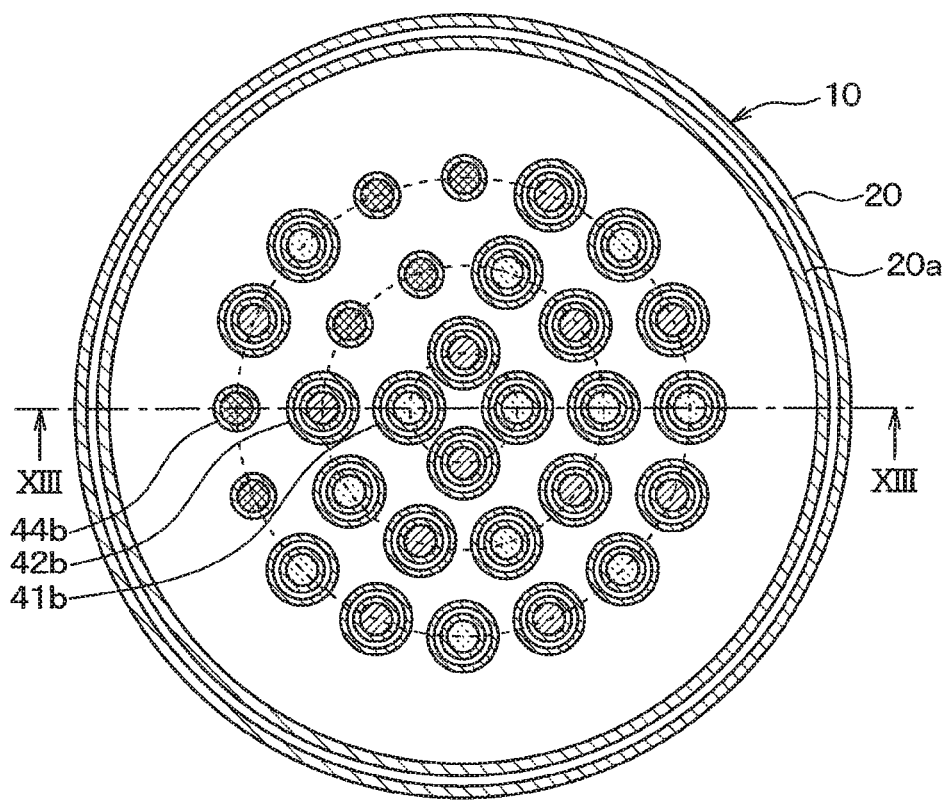
FIG. 14 is a cross-sectional view of the SiC semiconductor film forming apparatus taken along a line XIV-XIV in FIG. 13.

An SiC semiconductor film forming apparatus 10 according to this embodiment will be described with reference to FIGS. 13 and 14. FIG. 13 corresponds to a cross-sectional view taken along a line XIII-XIII in FIG. 14, and FIG. 14 corresponds to a cross-sectional view taken along a line XIV-XIV in FIG. 13.

As illustrated in FIG. 13, in this embodiment, an isolation chamber 40 further includes a fifth isolation chamber 45 as compared with the fourth embodiment. Specifically, a partition wall 45a is provided between a partition wall 44a and a partition wall 43a, and the fifth isolation chamber 45 is defined between the partition wall 44a and the partition wall 45a. As a gas inlet 30, a fifth inlet 35 for introducing a supply path barrier gas as a fifth gas is provided for the fifth isolation chamber 45, and supply paths 45b extending toward a growth space below the partition wall 43a are defined for the partition wall 45a.

The supply paths 45b are defined to surround supply paths 41b and 42b for supplying the SiC raw material containing gas or the C raw material containing gas. The supply paths 45b enable the supply path barrier gas in the fifth isolation chamber 45 to be introduced around the respective supply paths 41b and 42b. The supply path barrier gas is used for protecting the supply paths 41b and 42b. The supply path barrier gas may be any gas containing none of an Si raw material and a C raw material, and includes, for example, the same carrier gas as that of the third and fourth gases, a gas with an etching action including $H_2$, or an inert gas (rare gas) such as Ar or He. With the addition of HCl, the SiC products attributable to the etching action can be more effectively prevented.

As described above, the supply path barrier gas is introduced around the supply paths 41b and 42b for supplying the respective raw material gases with the results that the unnecessary Si products can be more restrained from being generated in the vicinity of the outputs of the supply paths 41b and 42b. With the above configuration, the particle sources can be prevented from being formed, and the SiC semiconductor smaller in the number of defects can be formed.

In this embodiment, a heating mechanism 80 is provided to surround a growth space in a furnace body 20, and located at a position above an SiC semiconductor substrate 70. The above configuration is of a hot wall structure in which the SiC semiconductor substrate 70 is heated from below by a heating mechanism 62 of a susceptor part 60, and the SiC semiconductor substrate 70 can be also heated from above by heating the outer peripheral side of the growth space.

With the above configuration, the furnace body 20 can be overall heated by heating the central part and the outer peripheral part of the furnace body 20 with both of the heating mechanisms 62 and 80, and the temperature distribution attributable to heating of only one of the central part and the outer peripheral part can be restricted from being generated. As a result, the uniformity of the temperature distribution in the plane of the SiC semiconductor substrate 70 is improved, and the uniformity of the doping concentration of the SiC semiconductor and the film thickness distribution in the plane of the SiC semiconductor substrate 70 can be improved.

Further, in this embodiment, a sixth inlet 36 is defined along an outer periphery of the furnace body 20. The sixth inlet 36 communicates with the interior of the furnace body 20 at a position below the isolation chamber 40, and a hot wall barrier gas as a sixth gas flows along an inner wall of the furnace body 20. A communication region of the furnace body 20 with the sixth inlet 36 is provided with a guide wall 20a that is spaced apart from the inner wall of the furnace body 20 at a predetermined interval, and the interior of the furnace body 20 has a double structure. With the above structure, the hot wall barrier gas can more easily flow along the inner wall of the furnace body 20 while being guided by the guide wall 20a disposed along the inner wall of the furnace body 20.

With the above configuration, the unnecessary Si products can be restrained from being formed on an inner peripheral wall surface of the furnace body 20 forming the hot wall. Therefore, the particle sources can be prevented from being formed, and the SiC semiconductor smaller in the number of defects can be formed.

(Other Embodiments)

The present disclosure is not limited to this embodiments described above and modifications can be suitably performed within a range of the appended claims.

For example, the above respective embodiments can be appropriately combined together. Specifically, as in the fifth embodiment, the configuration in which the diameters (cross-sectional areas) of the supply paths 41b and 42b are changed can be combined with the second to fourth embodiments. In the sixth embodiment, the case in which the lengths of the supply paths 41b and 42b are changed as compared with the first embodiment has been described. The same can be applied to the second to fifth, and seventh embodiments. In the seventh embodiment, the structure in which all of the fifth isolation chamber 45, the sixth inlet 36, and the heating mechanism 80 are provided has been exemplified. Alternatively, only one or two of those components may be provided. One or some of those components can be applied to the SiC semiconductor film forming apparatus 10 having the structure according to the first to sixth embodiments.

In the above respective embodiments, the Si raw material containing gas is introduced into the first isolation chamber 41, and the C raw material containing gas is introduced into the second isolation chamber 42. Alternatively, the C raw material containing gas may be introduced into the first isolation chamber 41, and the Si raw material containing gas may be introduced into the second isolation chamber 42.

In FIGS. 1, 3, 5, 7, 9, 11, and 13, the position of the outlets of the supply paths 41b, the supply paths 42b, or the supply paths 44b is located below the output of the supply paths 43b, but may be located substantially at the same position as that of the outlets of the supply paths 43b.

The invention claimed is:

1. A silicon carbide semiconductor film forming apparatus comprising:
    a furnace body that provides a growth space;
    a susceptor unit that is disposed in the furnace body, and provides an arrangement surface, on which an SiC semiconductor substrate is arranged;
    a gas inlet that includes a first inlet, through which a first gas is introduced into the furnace body, a second inlet, through which a second gas is introduced into the furnace body, and a third inlet, through which a third gas is introduced into the furnace body, the first gas being one of a silicon-raw material including gas and a carbon raw material including gas, the second gas being the other of the silicon raw material including gas and the carbon raw material including gas, and the third gas being a gas not including silicon and carbon; and
    a plurality of separation chambers that are separated into an upper chamber and a lower chamber by a plurality of partition walls disposed in an upper part of an inside of the furnace body, and include a first separation chamber, into which the first gas is introduced through the first inlet, a second separation chamber, into which the second gas is introduced through the second inlet, and a third separation chamber, into which the third gas is introduced through the third inlet, the first separation chamber, the second separation chamber, and the third separation chamber being arranged in order from the upper part of the inside of the furnace body, wherein:
    the partition wall partitioning the first separation chamber includes a plurality of first supply paths, each of which provides a supply path of the first gas and extends from the first separation chamber to a part of the inside of the furnace body below the plurality of separation chambers;

the partition wall partitioning the second separation chamber includes a plurality of second supply paths, each of which provides a supply path of the second gas and extends from the second separation chamber to another part of the inside of the furnace body below the plurality of separation chambers;

the partition wall partitioning the third separation chamber includes a plurality of third supply paths, each of which supplies the third gas between one of the first supply paths and one of the second supply paths;

the first gas, the second gas and the third gas are supplied to the SiC semiconductor substrate through the first supply paths, the second supply paths and the third supply paths, respectively, and an SiC semiconductor is epitaxially grown on a surface of the SiC semiconductor substrate;

an opening area density of the plurality of first supply paths, which is defined as an opening area of the first supply paths per unit area, at a center of the furnace body in a radial direction is different from the opening area density of the first supply paths at an outer peripheral part of the furnace body in the radial direction;

an opening area density of the plurality of second supply paths, which is defined as an opening area of the second supply paths per unit area, at the center of the furnace body in the radial direction is different from the opening area density of the second supply paths at the outer peripheral part of the furnace body in the radial direction;

the gas inlet includes a fourth inlet, through which a fourth gas not including silicon and carbon is introduced;

the plurality of separation chambers includes a fourth separation chamber, which is arranged between the second separation chamber and the third separation chamber and provided by a partition wall disposed in the upper part of the inside of the furnace body; and the partition wall partitioning the fourth separation chamber includes a plurality of fourth supply paths, each of which provides a supply path of the fourth gas and extends from the fourth separation chamber to a part of the inside of the furnace body below the plurality of separation chambers.

2. A silicon carbide semiconductor film forming apparatus comprising:

a furnace body that provides a growth space;

a susceptor unit that is disposed in the furnace body, and provides an arrangement surface, on which an SiC semiconductor substrate is arranged;

a gas inlet that includes a first inlet, through which a first gas is introduced into the furnace body, a second inlet, through which a second gas is introduced into the furnace body, and a third inlet, through which a third gas is introduced into the furnace body, the first gas being one of a silicon raw material including gas and a carbon raw material including gas, the second gas being the other of the silicon raw material including gas and the carbon raw material including gas, and the third gas being a gas not including silicon and carbon; and a plurality of separation chambers that are separated into an upper chamber and a lower chamber by a plurality of partition walls disposed in an upper part of an inside of the furnace body, and include a first separation chamber, into which the first gas is introduced through the first inlet, a second separation chamber, into which the second gas is introduced through the second inlet, and a third separation chamber, into which the third gas is introduced through the third inlet, the first separation chamber, the second separation chamber, and the third separation chamber being arranged in order from the upper part of the inside of the furnace body, wherein:

the partition wall partitioning the first separation chamber includes a plurality of first supply paths, each of which provides a supply path of the first gas and extends from the first separation chamber to a part of the inside of the furnace body below the plurality of separation chambers;

the partition wall partitioning the second separation chamber includes a plurality of second supply paths, each of which provides a supply path of the second gas and extends from the second separation chamber to another part of the inside of the furnace body below the plurality of separation chambers;

the partition wall partitioning the third separation chamber includes a plurality of third supply paths, each of which supplies the third gas between one of the first supply paths and one of the second supply paths;

the first gas, the second gas and the third gas are supplied to the SiC semiconductor substrate through the first supply paths, the second supply paths and the third supply paths, respectively, and an SiC semiconductor is epitaxially grown on a surface of the SiC semiconductor substrate;

a distribution of the opening area density of the first supply paths in a portion of the furnace body facing the arrangement surface of the susceptor unit, on which the silicon carbide semiconductor substrate is arranged, is different from a distribution of the opening area density of the second supply paths;

the gas inlet includes a fourth inlet, through which a fourth gas not including silicon and carbon is introduced;

the plurality of separation chambers includes a fourth separation chamber, which is arranged between the second separation chamber and the third separation chamber and provided by a partition wall disposed in the upper part of the inside of the furnace body; and the partition wall partitioning the fourth separation chamber includes a plurality of fourth supply paths, each of which provides a supply path of the fourth gas and extends from the fourth separation chamber to a part of the inside of the furnace body below the plurality of separation chambers.

3. The silicon carbide semiconductor film forming apparatus according to claim 1, wherein: an in-plane distribution of an opening area density, which is defined as a total opening area of the first supply paths, the second supply paths, and the fourth supply paths per unit area, in a portion of the furnace body facing the arrangement surface the susceptor unit, on which the silicon carbide semiconductor substrate is arranged, at the center of the furnace body in the radial direction is equal to the in-plane distribution of the opening area density at the outer peripheral part of the furnace body in the radial direction.

4. The silicon carbide semiconductor film forming apparatus according to claim 1, wherein: the first to fourth supply paths are made of different materials corresponding to gas types of the first to fourth gases flowing in the first to fourth supply paths, respectively.

5. The silicon carbide semiconductor film forming apparatus according to claim 1, wherein:
- a cross-sectional area of the first supply paths at the center of the furnace body in the radial direction is different from the cross-sectional area of the first supply paths at the outer peripheral part of the furnace body in the radial direction; and
- a cross-sectional area of the second supply paths at the center of the furnace body in the radial direction is different from the cross-sectional area of the second supply paths at the outer peripheral part of the furnace body in the radial direction.

6. The silicon carbide semiconductor film forming apparatus according to claim 1, wherein:
- a distance between an outlet of the first gas in the first supply paths and the arrangement surface of the susceptor unit, on which the silicon carbide semiconductor substrate is arranged, at the center of the furnace body in the radial direction is different from the distance at the outer peripheral part of the furnace body in the radial direction; and
- a distance between an outlet of the second gas in the second supply paths and the arrangement surface of the susceptor unit, on which the silicon carbide semiconductor substrate is arranged, at the center of the furnace body in the radial direction is different from the distance at the outer peripheral part of the furnace body in the radial direction.

7. The silicon carbide semiconductor film forming apparatus according to claim 1, further comprising: a plurality of fifth supply paths, each of which surrounds each of the first supply paths and the second supply paths, and introduces a fifth gas not including silicon and carbon.

8. The silicon carbide semiconductor film forming apparatus according to claim 1, wherein:
- the susceptor unit includes a first heating mechanism that heats the silicon carbide semiconductor substrate from a below part of the furnace body, the silicon carbide semiconductor film forming apparatus further comprising:
- a second heating mechanism that surrounds the growth space inside of the furnace body, and is located at a position above the silicon carbide semiconductor substrate, wherein:
- the first heating mechanism heats the silicon carbide semiconductor substrate from the below part of the furnace body, and the second heating mechanism heats an outer peripheral wall of the furnace body, so that a hot wall is provided and the silicon carbide semiconductor substrate is heated from an upper direction and a lower direction of the furnace body.

9. The silicon carbide semiconductor film forming apparatus according to claim 8, further comprising: a hot wall barrier gas inlet defined as a gas inlet that flows a gas along an inner wall of the furnace body.

10. The silicon carbide semiconductor film forming apparatus according to claim 9, wherein:
- the furnace body has a double structure, in which a guide wall spaced apart from an inner wall of the furnace body by a predetermined distance is disposed in the furnace body; and
- a hot wall barrier gas flows along the inner wall of the furnace body using the guide wall.

11. A silicon carbide semiconductor film forming method using the silicon carbide semiconductor film forming apparatus according to claim 1, wherein: the silicon raw material including gas is a silicon raw material gas with HCl.

12. A silicon carbide semiconductor film forming method using the silicon carbide semiconductor film forming apparatus according to claim 1, wherein:
- the silicon raw material including gas is a silicon raw material gas with an inert gas as a carrier gas; and
- HCl is introduced from a gas inlet different from a gas inlet for the silicon raw material including gas.

13. The silicon carbide semiconductor film forming method according to claim 11, wherein: the third gas is one of $H_2$, Ar, and He functioning as a carrier gas.

14. A silicon carbide semiconductor film forming method using the silicon carbide semiconductor film forming apparatus according to claim 1, wherein: the silicon raw material including gas is a chloride-based raw material gas.

* * * * *